United States Patent [19]
Iwata et al.

[11] Patent Number: 5,753,891
[45] Date of Patent: May 19, 1998

[54] TREATMENT APPARATUS

[75] Inventors: Teruo Iwata; Kenji Nebuka, both of Nirasaki; Mitsuaki Komino, Nakano-Ku, all of Japan

[73] Assignee: Tokyo Electron Limited, Tokyo-to, Japan

[21] Appl. No.: 522,148

[22] Filed: Aug. 31, 1995

[30] Foreign Application Priority Data

| Aug. 31, 1994 | [JP] | Japan | 6-232163 |
| Feb. 8, 1995 | [JP] | Japan | 7-043429 |
| Feb. 10, 1995 | [JP] | Japan | 7-046344 |

[51] Int. Cl.$^6$ .................. H01L 35/32; H05B 3/04
[52] U.S. Cl. .......... 219/390; 219/402; 219/536; 219/541; 373/125
[58] Field of Search .................. 219/402, 409, 219/390, 391, 464, 501, 503, 520–523, 536, 541, 542, 544; 373/110, 117, 125, 127; 427/545; 392/497; 432/120, 152; 118/724, 725, 728

[56] References Cited

U.S. PATENT DOCUMENTS

| 4,171,346 | 10/1979 | King et al. | 219/390 |
| 5,109,473 | 4/1992 | Rezabek et al. | 219/523 |
| 5,306,895 | 4/1994 | Ushikoshi et al. | 118/725 |
| 5,462,603 | 10/1995 | Murakami | 118/724 |
| 5,536,478 | 7/1996 | Lipp et al. | 219/541 |

FOREIGN PATENT DOCUMENTS

| 2850722 | 5/1980 | Germany . |
| 58-111347 | 7/1983 | Japan . |
| 61-94559 | 6/1986 | Japan . |
| 62-47123 | 3/1987 | Japan . |
| 2-271612 | 11/1990 | Japan . |
| 3-37189 | 2/1991 | Japan . |
| 3-49355 | 10/1991 | Japan . |
| 4-355922 | 12/1992 | Japan . |
| 5-1222 | 1/1993 | Japan . |
| 6-260678 | 9/1994 | Japan . |
| 7-78778 | 3/1995 | Japan . |

*Primary Examiner*—Teresa J. Walberg
*Assistant Examiner*—J. Pelham
*Attorney, Agent, or Firm*—Beveridge, DeGrandi, Weilacher & Young, LLP

[57] ABSTRACT

A treatment apparatus comprises a heater including an insulator carrying a to-be-treated object thereon and a resistance heating element therein for heating the to-be-treated object, an electrical supply mechanism including feeders extending into a treatment chamber from outside and terminals connecting the feeders and the resistance heating element, and a metallic pipe surrounding the terminals and those portions of the feeders which extend in the treatment chamber. A treatment apparatus for discharging an exhaust gas from the treatment chamber through an exhaust pipe by means of a suction unit comprises a first heater in the inner wall of the treatment chamber for heating the gas in the treatment chamber, and a second heater for independently heating the exhaust gas in the exhaust pipe at various portions of the exhaust pipe.

7 Claims, 12 Drawing Sheets

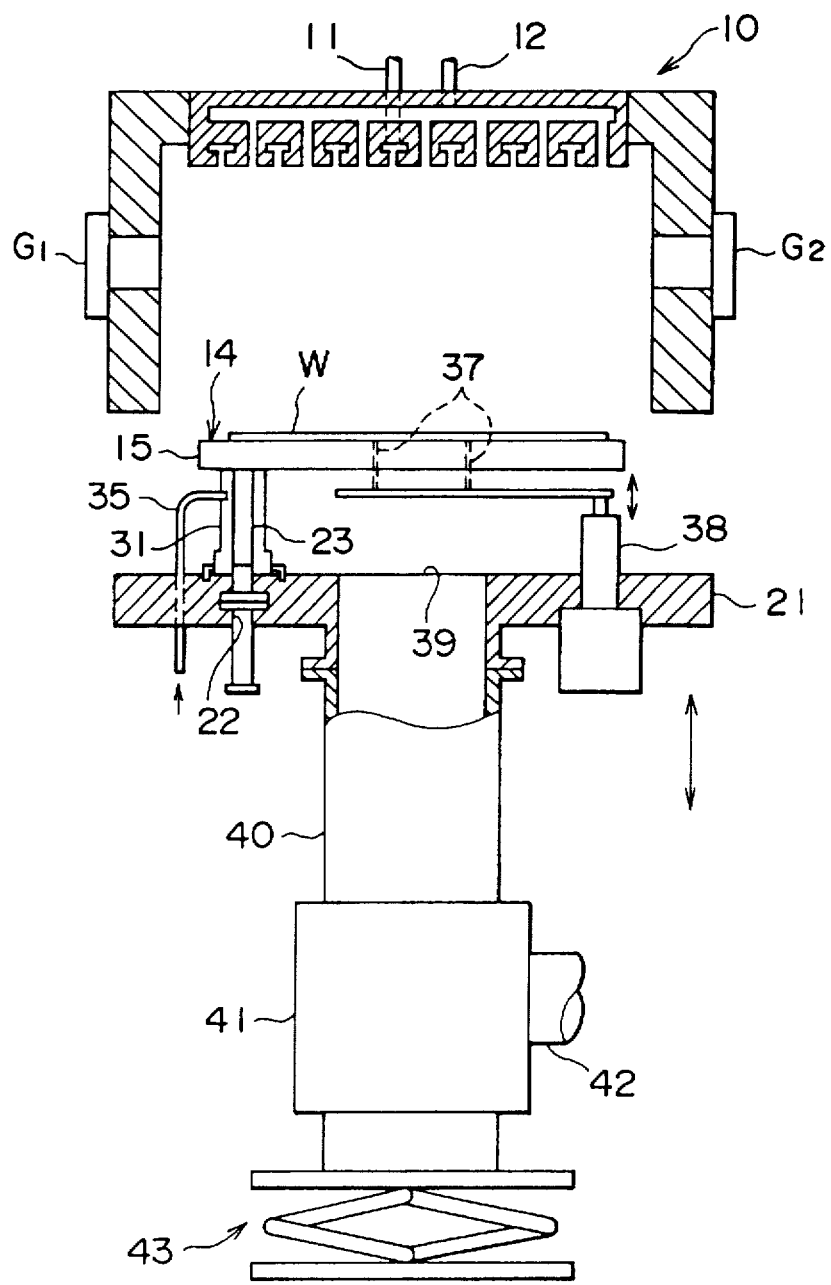
F I G. 6

TREATMENT APPARATUS

BACKGROUND OF THE INVENTION

1. Field of the Invention

The present invention relates to a treatment apparatus with improved heating structures for a to-be-treated object and an exhaust line.

2. Information of the Related Art

In semiconductor manufacturing processes, treatments for film formation, such as chemical vapor deposition (CVD), sputtering, etc., are conducted to form an integrated circuit on a semiconductor wafer (hereinafter referred to as "wafer"), such as silicon. In these treatments for film formation, it is an essential technique to heat to and maintain the whole surface of the wafer uniformly at a predetermined temperature in order to form a film uniformly on the wafer.

In general, wafer heating methods include methods which use heaters and methods which utilize energy lines of lamps and the like. FIG. 7 shows a wafer carrier of a conventional film forming apparatus using, for example, a ceramic heater and its peripheral arrangement. A ceramic body 1, which doubles as the wafer carrier, is located in the lower part of a treatment chamber, a vacuum chamber. A resistance heating wire 2 of, e.g., tungsten is embedded in the ceramic body 1. The opposite end portions of the heating wire 2 are connected to a pair of feeders 4 of, e.g., copper by means of a pair of terminals 3, individually. Each feeder 4 is surrounded by a sheath 5 of, e.g., stainless steel, and is drawn out of a wall 6 of the treatment chamber.

A thermocouple unit 8, generally called a sheath thermocouple, is inserted in a recess 7 in the lower surface of the ceramic body 1. The sheath thermocouple 8 is composed of a sheath of, e.g., stainless steel and a thermocouple contained therein.

In the film forming apparatus constructed in this manner, the treatment chamber is evacuated to a predetermined degree of vacuum and fed with a film forming gas, and the resistance heating wire 2 is supplied with electric power by means of the feeders 4. Thereupon, the ceramic body 1 is heated, and its temperature, i.e., the temperature of a wafer W, is controlled so as to be fixed for film formation in accordance with a detected temperature value of the sheath thermocouple 8.

The sheathes 5 which cover the feeders 4 are formed of a metal, whose coefficient of thermal expansion is very different from that of the ceramic body 1. The temperature for film formation is as high as, for example, 600° C. to 700° C. Thus, even though the sheathes 5 are bonded to the ceramic body 1, there is a possibility of the wires 5 and the body 1 cracking due to the difference in the manner of thermal expansion at high temperature between them. Conventionally, therefore, the sheathes 5 and the ceramic body 1 are not bonded to one another, so that the terminals 3 are exposed.

Since the terminals 3 are exposed in this manner, they are bound to be touched by gases in the treatment chamber. In many cases, halogen gases are used as film forming gases. Highly corrosive halogen gases are produced by gaseous reaction, and the corrosiveness of the halogen gases are extremely augmented at high temperature during the process. Accordingly, the terminals 3 are corroded, and the resulting corrosion products are separated, thereby producing particles. Thus, the terminals 3 cannot enjoy a long life.

In some cases, electrically conductive films may be adhesively deposited on that portion of the lower surface of the ceramic body 1 situated between the terminals 3. Since the terminals 3 are exposed, as mentioned before, they may possibly be short-circuited by the adhering films. In case of such short-circuiting, electric power cannot be steadily supplied to the resistance heating wire 2, so that the temperature of the ceramic body 1, that is, the temperature of the wafer W, may possibly become unstable. As a result, the in-plane uniformity of the film thickness may be so poor that desired film formation cannot be achieved.

In general, the thermocouple unit 8 of the sheath thermocouple is not very high in sensitivity, since it conducts heat only by radiation when the degree of vacuum is high, that is, when the pressure is low. In the treatment apparatus shown in FIG. 7, the thermocouple unit 8 is housed in the recess 7 in the ceramic body 1 and exposed in the treatment chamber. When the degree of vacuum in the treatment chamber is high, that is, when the pressure is low, the sensitivity of the thermocouple unit 8 is relatively low and requires improvement.

In semiconductor wafer manufacturing processes, various treatments, such as film formation, etching, ashing, etc., are carried out. In the process of film formation among these vacuum treatments, for example, by-products of reaction are discharged from a vacuum chamber through its exhaust port and an exhaust line. In the etching process, products of reaction between treatment gases and components scraped off from the surface of a wafer are discharged in like manner. If the exhaust line is not heated to a predetermined temperature, in this case, the products inevitably adhere to the inner wall of the exhaust line. The production of the deposits and a conventional measure to counter it will now be described taking the case of a CVD apparatus. As shown in FIG. 15, for example, a plasma CVD apparatus comprises a hermetically sealed treatment chamber 51, a susceptor supporting portion 52 in the treatment chamber 51, a susceptor 53 as a lower electrode supported on the supporting portion 52, and a gas inlet chamber 54 as an upper electrode facing the susceptor 53. An exhaust pipe 55, which is connected to a vacuum pump 56, is attached to the lower part of the treatment chamber 51.

For example, the treatment chamber 51 is evacuated through the exhaust pipe 55 to be kept at a predetermined pressure as film forming gases, such as $SiH_2Cl_2$ and $NH_3$ gases, into the chamber 51 through the gas inlet chamber 54. The film forming gases are converted into plasmas by applying high-frequency power between the electrodes 53 and 54, a film of $Si_3N_4$ is formed on a wafer W which is placed on the susceptor 53, as indicated by equation (1) as follows:

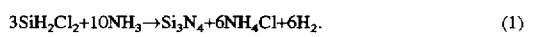
$$3SiH_2Cl_2+10NH_3 \rightarrow Si_3N_4+6NH_4Cl+6H_2. \tag{1}$$

When the CVD process is conducted in this manner, however, $NH_4Cl$ and other by-products of reaction adhere to the exhaust pipe 55.

If a plasma CVD process which includes a step of film formation given by equation (2) and an etch-back step given by equation (3) is carried out by means of the aforementioned apparatus, the following by-products of reaction adhere to the exhaust pipe 55.

$$2SiH_4+2NH_3 \rightarrow 2SiN+7H_2, \tag{2}$$

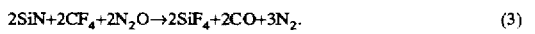
$$2SiN+2CF_4+2N_2O \rightarrow 2SiF_4+2CO+3N_2. \tag{3}$$

(a) $CF_4$ is polymerized in the manner indicated by equation (4), and the resulting polymer ($CF_2$—$CF_2$—$CF_2$) adheres to the exhaust pipe 55.

$$CF_4 \rightarrow CF_2-CF_2-CF_2. \quad (4)$$

(b) $SiO_2$, $(NH_4)_2SiF_6$, $NH_4HF_2$, and other complicated ammonium-based compounds are produced, as indicated by equation (5), by interactions between the processes of film formation, etch-back, and air leakage, and adhere to the exhaust pipe 55.

$$SiH_4+NH_3+CF_4+O_2 \rightarrow SiO_2+(NH_4)_2SiF_6+NH_4HF_2+ \ldots \quad (5)$$

(c) If air leaks through joints of the exhaust pipe 55, $SiO_2$, a glassy product, is produced, as indicated by equation (6), and adheres to the exhaust pipe 55.

$$SiH_4+O_2 \rightarrow SiO_2+2H_2. \quad (6)$$

These by-products of reaction adhere to the inner wall of the treatment chamber 51 as well as to the exhaust pipe 55. When these deposits adhere to the inner wall of the exhaust pipe 55, thereafter, the exhaust efficiency of the treatment chamber 51 may change with time, resulting in variation of the treatment of the wafer W. If the deposits are on the inner wall of the exhaust pipe 55, they scatter from the pipe 55 to the treatment chamber 51 when the pressure in the chamber 51 is changed, for example, from a vacuum pressure to the atmospheric pressure. As a result, the deposits are reduced to particles which adhere to the wafer W, thereby lowering the yield of the wafer treatment.

Removing the deposits requires cleaning. Cleaning of the exhaust system involves troublesome operations, such as the removal of pipes, valves, and the vacuum pump, pump washing, etc., and lowers the operating efficiency of the treatment apparatus. In the case where the by-products of reaction have corrosiveness depending on the style of the plasma treatment, the exhaust pipe 55 is bound to be corroded. It is necessary, therefore, to minimize the products which adhere to the exhaust system.

Conventionally, the adhesion of by-products of reaction to the exhaust pipe 55 is prevented by connecting a tape heater 58 in series with the outer peripheral surface of the exhaust pipe 55 so as to cover the overall length of the pipe 55 and heating the pipe 55 by means of the heater 58. The heater 58 is arranged in a manner such that a cooling trap (not shown) can be attached to that portion of the exhaust pipe 55 which is situated nearest to the vacuum pump 56 in the longitudinal direction of the pipe 55. In this trap, exhaust gas is cooled to a temperature not higher than its sublimation temperature, whereupon by-products of reaction in the gas are forced to separate out and removed so that they can be prevented from adhering to the inside of the vacuum pump 56.

FIG. 16 shows a vapor pressure curve of a substance. In FIG. 16, the area below the curve represents the substance in a gaseous phase, while the area above the curve represents the substance in a solid phase. In order to restrain the by-products of reaction from adhering to the exhaust pipe 55, the products are expected to pass in the gaseous phase through the pipe 55. The phase of a substance is settled depending on the relationship between pressure and temperature, which changes substantially in proportion to each other. However, the phase change of each by-product in the exhaust pipe 55 from the solid phase to the gaseous phase does not depends indiscriminately on a microscopic temperature-pressure relationship which is based on the vapor pressure curve for the substance, and is determined by the incidence of solid nuclei even in the solid area. More specifically, the incidence of solid nuclei increases with distance from the vapor pressure curve on the upper side thereof, and more by-products of reaction adhere to higher-incidence regions.

Thus, in the apparatus described above, the pressure in the exhaust pipe 55 lowers from an exhaust port of the treatment chamber 51 toward the vacuum pump 56. To keep the products in the gaseous phase, therefore, the temperature in the exhaust pipe 55 may be lower on the vacuum pump side than on the treatment chamber side.

In the above-described apparatus, however, the entire exhaust pipe 55 is heated uniformly by means of unit heaters of the tape heater which are connected in series. Accordingly, unnecessary portions are bound to be heated, thus entailing waste of energy. A large quantity of products adhere to regions in which pressure and temperature are in an optimum state. If those regions are heated to ruin the optimum state, products inevitably adhere to regions in which pressure and temperature assume the optimum state on the next occasion.

If the exhaust pipe 55 is provided with the trap (not shown), moreover, the region up to the point just short of the trap is heated to a temperature much higher than the sublimation temperatures of the products, so that the gases cannot be fully cooled to the solid phase in that region. Accordingly, some of the by-products of reaction, remaining in the gaseous phase without being condensed, get into the vacuum pump 56 through the trap, so that the products cannot be satisfactorily prevented from adhering to the inside of the pump 56. The trap of this type cannot fulfill its original function, although it is intended to minimize the downtime which is attributable to the adhesion of products in the vacuum pump 56, that is, the time required for the cleaning and maintenance of the vacuum pump.

SUMMARY OF THE INVENTION

A first object of the present invention is to provide a treatment apparatus, in which terminals are prevented from being corroded so that they can enjoy a longer life, adhesion of a film between the terminals is prevented to check a short circuit, and the sensitivity of a thermocouple unit is improved.

A second object of the invention is to provide a treatment apparatus, in which adhesion of exhausted substances in an exhaust pipe can be prevented in a manner such that waste of energy is reduced, by-products of reaction and the like can be caused to separate out fully in a trap portion, and adhesion of exhausted substances in an exhaust line can be prevented despite the change of treatment processes for a to-be-treated object.

In order to achieve the first object, a treatment apparatus according to the present invention, which is an apparatus for treating a to-be-treated object in a treatment chamber with a treatment gas, comprises: heating means including an insulator carrying the to-be-treated object thereon and a resistance heating element therein for heating the to-be-treated object; electrical supply means including feeders extending into the treatment chamber from outside and terminals connecting the feeders and the resistance heating element; and a metallic pipe surrounding the terminals and those portions of the feeders which extend in the treatment chamber.

Thus, the feeders are surrounded by the metallic pipe, and the distal end of the metallic pipe is bonded to the insulator (e.g., ceramics) of the heating means. Accordingly, the terminals and the feeders are hermetically isolated from the treatment chamber, so that there is no possibility of their being corroded.

The metallic pipe includes a ring body bonded to the insulator, the ring body having a coefficient of thermal expansion approximate to that of the insulator. Accordingly, the metallic pipe and the insulator can be prevented from cracking at their joint portions at high temperature.

The treatment apparatus further comprises gas supply means for feeding an inert gas into the metallic pipe. Accordingly, the feeders and the terminals are put in an inert gas atmosphere, so that they can be prevented from being touched by the treatment gases, and therefore, from being corroded.

The treatment apparatus further comprises a protective pipe surrounding the metallic pipe and gas supply means for feeding an inert gas into the protective pipe. Thus, the inert gas is introduced into the protective pipe while the to-be-treated object is being treated with the treatment gas. The inert gas is discharged into the treatment chamber through the protective pipe. Accordingly, the metallic pipe, feeders, and terminals are put in the inert gas atmosphere, so that they can be prevented from being touched by the treatment gases, and therefore, from being corroded. When the treatment chamber is cleaned inside with, for example, $ClF_3$ and $NF_3$ gases, moreover, the gases cannot reach and corrode the surface of the metallic pipe.

In order to achieve the second object, a treatment apparatus according to the present invention, which is an apparatus for treating a to-be-treated object in a treatment chamber with a treatment gas and discharging an exhaust gas from the treatment chamber through an exhaust pipe by means of a suction unit, comprises: first heating means in the inner wall of the treatment chamber for heating the gas in the treatment chamber; and second heating means for independently heating the exhaust gas in the exhaust pipe at various portions of the exhaust pipe. Thus, exhausted substances can be prevented from separating out and adhering to the inner wall of the exhaust line in a manner such that waste of energy is reduced. Since the inner wall of the treatment chamber and the exhaust line are provided with the first and second heating means, respectively, adhesion of exhausted substances to the inner wall of the treatment chamber, as well as to the exhaust line, can be restrained.

The heaters include a plurality of resistance heating elements wound around various portions of the exhaust pipe and connected in parallel with one another. Thus, the heating temperature can be controlled for each heating means, and the exhaust line can be heated at appropriate temperatures for the respective sublimation temperatures of various parts thereof. Accordingly, the adhesion of exhausted substances in the exhaust line can be prevented in a manner such that waste of heating energy is reduced. In the case where the exhaust line is provided with the trap, the exhausted substances can be securely condensed and caused to separate out in the trap.

The treatment apparatus further comprises temperature detecting means for detecting the temperature of the exhaust gas in each of various positions in the exhaust pipe, pressure detecting means for detecting the pressure of the exhaust gas in each of various positions in the exhaust pipe, and control means for controlling the second heating means in accordance with signals from the temperature and pressure detecting means. Since control means are provided for individually controlling the first and second heating means in accordance with pressure and temperature signals for the interior of the treatment chamber; the inner wall of the treatment chamber and the exhaust line can be heated at appropriate temperatures for the respective sublimation temperatures of the exhausted substances discharged from the treatment chamber. Thus, the adhesion of the exhausted substances to the inner wall of the treatment chamber and the exhaust line can be prevented in a manner such that waste of heating energy is reduced.

The control means is stored with a heat program for setting the temperature of the exhaust gas in the exhaust pipe depending on the kind of the exhaust gas, the heat program being previously set in accordance with process conditions and a vapor pressure curve. Thus, by registering the control unit with various process conditions, the first and second heating means can be controlled in conformity to the process conditions even though the conditions are changed. Thus, the exhausted substances can be prevented from adhering to the inner wall of the treatment chamber and the exhaust line.

The control means continually analyzes elements in the exhaust gas and reaction formed material, detects the pressure during the analysis, and controls the second heating means in accordance with vapor pressure curves for the analyzed elements so that the temperature of the exhaust gas is in a gas area. Thus, adhesion of the exhaust gas and reaction formed material can be controlled on a real-time basis.

BRIEF DESCRIPTION OF THE DRAWINGS

FIG. 6 is a longitudinal sectional view showing a state in which a base plate portion of a treatment chamber is lowered;

DETAILED DESCRIPTION OF THE PREFERRED EMBODIMENTS

Preferred embodiments of the present invention will become understood from the following detailed description referring to the accompanying drawings.

Figure 1:
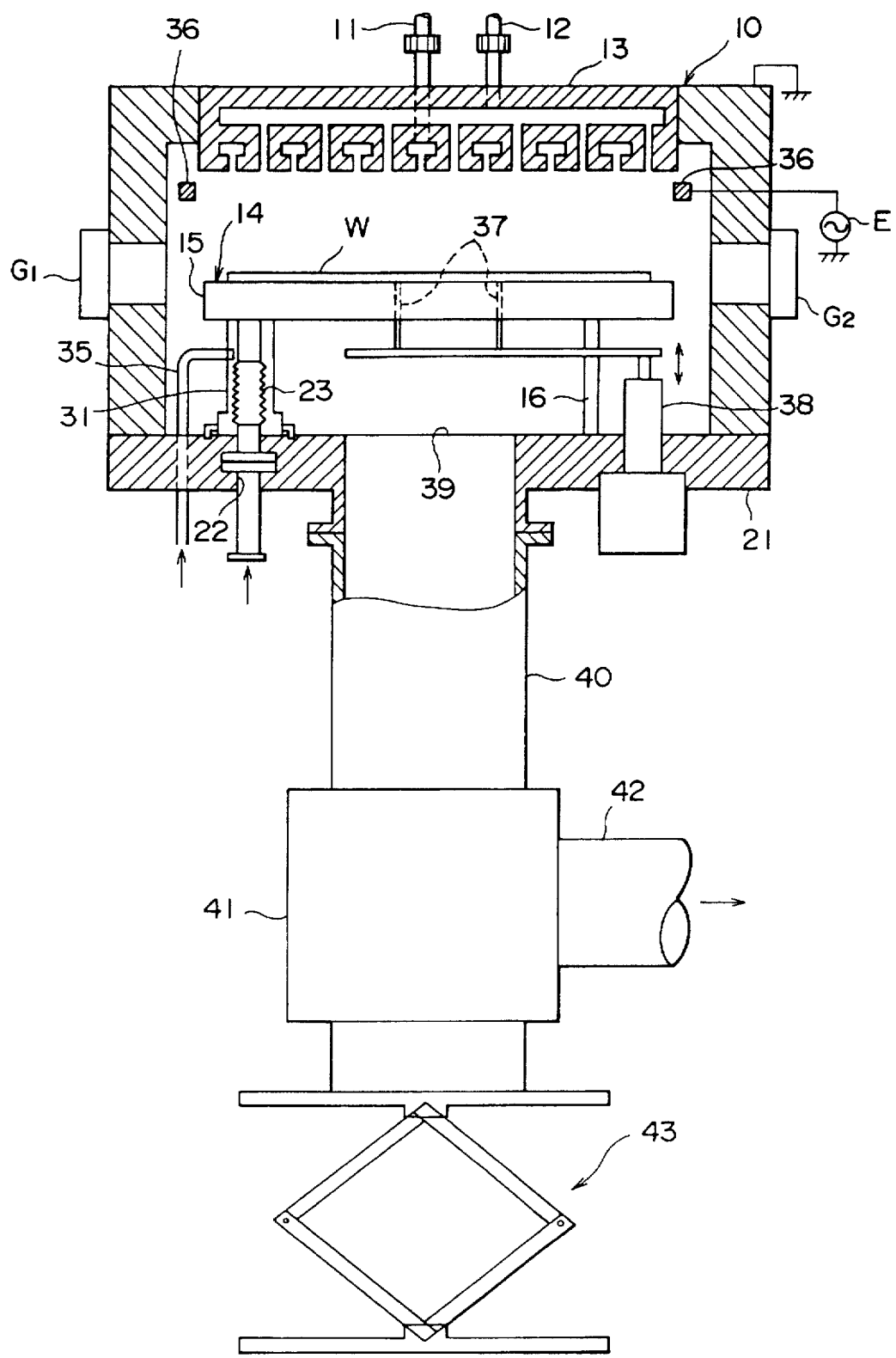
FIG. 1 is a longitudinal sectional view showing an outline of a treatment apparatus according to a first embodiment of the present invention.

FIG. 1 is a view showing a first embodiment in which a treatment apparatus according to the present invention is applied to a CVD apparatus. In FIG. 1, numeral 10 denotes an airtight treatment chamber formed of, e.g., aluminum. Attached to the side wall of the treatment chamber 10 are valves G1 and G2 for opening and closing inlet and outlet ports, respectively, for wafers W. The treatment chamber 10 is topped by a gas supply unit 13 which separately feeds TiCl$_4$ gas and NH$_3$ gas, delivered from, for example, gas supply pipes 11 and 12, respectively, into the treatment chamber 10.

The treatment chamber 10 contains heating means, e.g., a ceramic heater 14, which constitutes a wafer carrier facing the gas supply unit 13. The ceramic heater 14 is provided with a ceramic body 15 which is formed of an insulator, such as aluminum nitride (AlN), silicon nitride (SiN), or aluminum oxide (Al$_2$O$_3$). The ceramic body 15 is supported on a base plate 21 of the treatment chamber 10 by means of a supporting rod 16.

Figure 2:
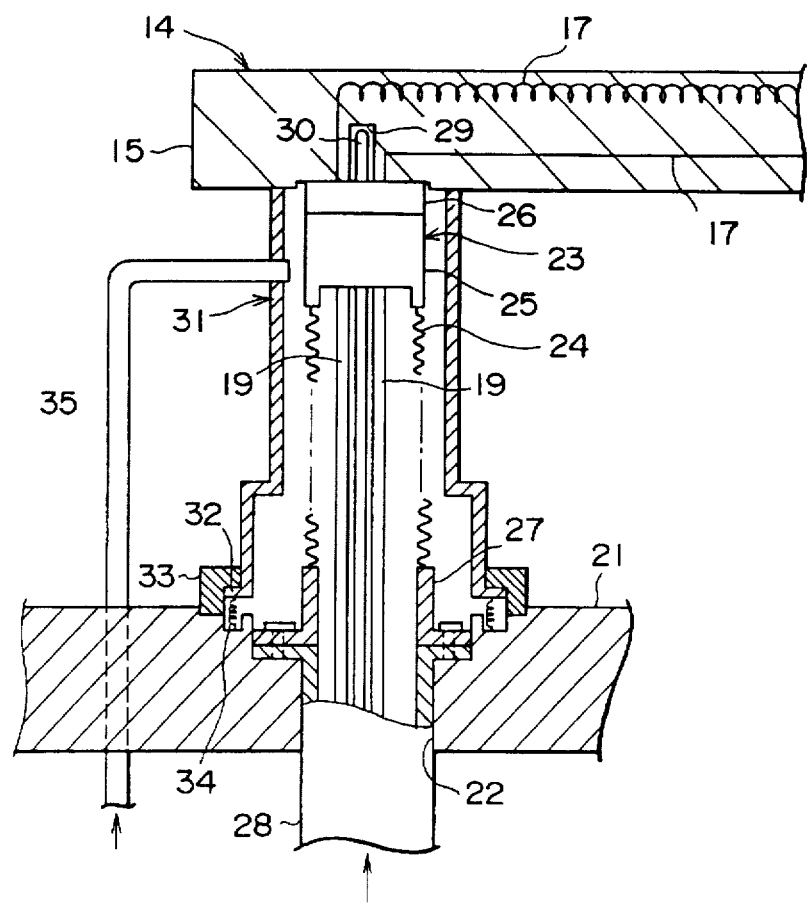
FIG. 2 is a sectional view showing a wiring arrangement portion of a heater shown in FIG. 1.
Figure 3:
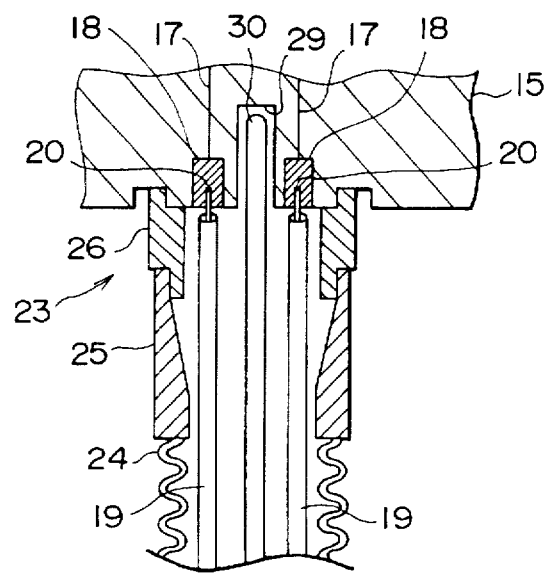
FIG. 3 is a sectional view showing an internal configuration of the wiring arrangement portion shown in FIG. 2.

Embedded in the ceramic body 15, as shown in FIG. 2, is a resistance heating wire 17 which is formed of, for example, tungsten (W), molybdenum (Mo), tantalum (Ta), or nickel-chromium (Ni—Cr) alloy. As shown in FIG. 3, the opposite ends of the heating wire 17 are connected to a pair of feeders 20, which are covered individually by insulating tubes 19, by means of terminals 18, individually. The terminals 10 are formed of a metal, e.g., molybdenum, whose coefficient of thermal expansion resembles that of the ceramic body 15.

The following is a detailed description of a wiring arrangement portion of the resistance heating wire 17. The feeders 20 are drawn out through a through hole 22 which is formed in the base plate 21 of the treatment chamber 10, as shown in FIG. 2. An anticorrosion metallic pipe 23 of, e.g., US316, Inconel, or Hastelloy is provided between the lower surface of the ceramic body 15 and the base plate 21 so as to surround the feeders 20 and the like.

The metallic pipe 23 includes a molded bellows or flexible tube 24 of stainless steel, Hastelloy, or Inconel. An end piece 25 of stainless steel is fixed to the upper end of the flexible tube 24. On the upper end of the end piece 25, moreover, a ring body 26 of a metal, e.g., molybdenum, whose coefficient of thermal expansion resembles that of the ceramic body 15 is brazed hermetically to the ceramic body 15.

A ring piece 27, which constitutes part of the metallic pipe 23, is bonded to the lower end of the flexible tube 24, and a metallic drawer tube 28 is bonded to the lower end of the ring piece 27. A tubular portion which includes the ring piece 27 and the drawer tube 28 is bonded hermetically to the through hole 22 of the base plate 21. Thus, the feeders 20 are drawn out of the treatment chamber 10.

In the present embodiment, the upper end portion of a thermocouple unit 30, called a sheath thermocouple, is inserted in a recess 29 in the lower surface of the ceramic body 15. When the recess 29 is loaded with an inert gas, as mentioned later, therefore, the pressure around the thermocouple unit 30 becomes relatively high, so that heat can be transmitted to the unit 30 via a medium. Thus, the sensitivity of the thermocouple unit 30 is improved. The unit 30 extends in the metallic pipe 23.

As shown in FIG. 2, the metallic pipe 23 is surrounded by a protective pipe 31 of an anticorrosion nonmetallic material, e.g., quartz, in a manner such that a cylindrical space is defined around the pipe 23. The protective pipe 31 may be formed of, for example, ceramics instead of quartz.

The protective pipe 31 is supported by a ring member 33 for vertical movement, and is urged upward by a spring 34 which is interposed between the base plate 21 and a flange 32 on the lower end of the pipe 31. Thus, the upper end of the protective pipe 31 is in contact with the lower surface of the ceramic body 15 under a small force of pressure. When the protective pipe 31 is loaded with the inert gas, as mentioned later, therefore, the gas is allowed to leak from the pipe 31 into the treatment chamber 10.

The metallic pipe 23 is designed so as to be supplied with an inert gas, e.g., N$_2$, He, or Ar gas, through an inert gas source and a supply pipe (not shown).

The protective pipe 31 is connected with an inert gas supply pipe 35 of, e.g., quartz, through which the inert gas, e.g., N$_2$, He, or Ar gas, is supplied from the inert gas source (not shown).

The following is a description of other parts than the wiring arrangement portion described above. As shown in FIG. 1, a plasma generating electrode 36, which is used to clean the interior of the treatment chamber 10, for example, is located along the peripheral edge of the ceramic heater 14. High-frequency voltage from a high-frequency power source E is applied between the electrode 36 and the wall portion of the treatment chamber 10. The base plate 21 of the treatment chamber 10 is fitted with a drive mechanism 38 for raising and lowering pusher pins 37 which are used to deliver a wafer W between the wafer carrier (ceramic heater) 14 and an external transfer arm (not shown). The pusher pins 37 are arranged so as to support, for example, three points on the wafer W, and penetrate the wafer carrier 14.

Formed in central portion of the base plate 21, moreover, is an exhaust port 39 or an opening at one end of an exhaust pipe 40. The exhaust pipe 40 extends straight downward, and is connected to a turbo molecular pump 41. An exhaust pipe 42, which is connected to a dry pump (not shown), is attached to the flank of the molecular pump 41, and a jack mechanism 43 to the bottom of the pump 41. Thus, the base plate 21 of the treatment chamber 10 is removably bonded to the lower end portion of the side wall of the chamber 10 in an airtight manner, and can be raised or lowered by means of the jack mechanism 43.

The following is a description of the operation of the embodiment described above.

First, the wafer W, a to-be-treated object, is introduced into the treatment chamber 10 through a gate valve G1 by means of the transfer arm (not shown), and placed on the wafer carrier (ceramic heater) 14. Electric power is supplied from a power supply unit (not shown) to the heating wire 17 through the feeders 20. Thereupon, the ceramic body 15 is heated, whereby the wafer W is heated to a predetermined temperature. Also, treatment gases, e.g., TiCl$_4$ gas and NH$_3$ gas, are introduced into the treatment chamber 10 through the gas supply unit 13 at a predetermined flow rate. The treatment chamber 10 is kept at a predetermined degree of vacuum by evacuating the exhaust pipe 40 by means of the turbo molecular pump 41, and a TiN film is formed on the surface of the wafer W.

While this gas treatment, e.g., film formation, is being carried out, on the other hand, the inert gas is fed into the metallic pipe 23 which is attached hermetically to the ceramic body 15. Thereupon, the feeders 20 and the terminals 18 are put in an inert gas atmosphere, so that they can be prevented from being touched by the treatment gases, and therefore, from being corroded.

Figure 4:
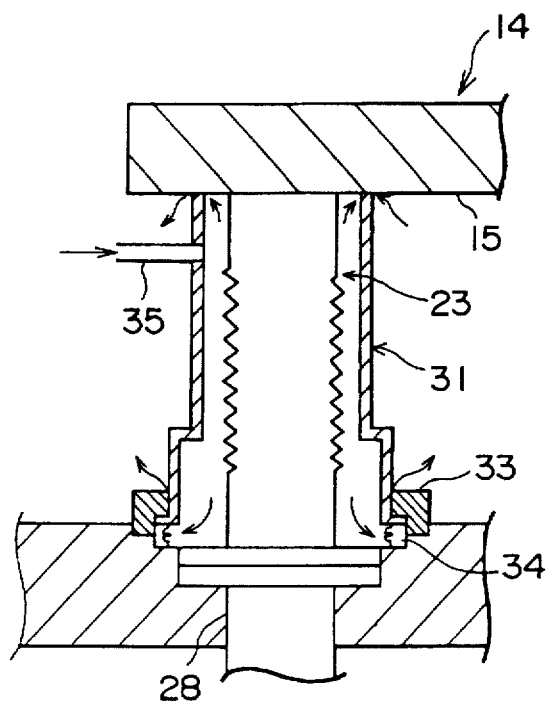
FIG. 4 is a diagram for illustrating a flow of an inert gas in a protective pipe.

While the gas treatment, e.g., film formation, is carried out, moreover, the inert gas is fed from the inert gas supply pipe 35 into the protective pipe 31 at a rate of, for example, 50 SCCM. The opposite end portions of the protective pipe 31 are not bonded hermetically to the ceramic heater 14 and the base plate 21 of the treatment chamber 10, but are only softly in contact therewith. As shown in FIG. 4, therefore, the inert gas flows out into the treatment chamber 10 through the gap between the opposite end portions of the protective pipe 31, so that the tube 31 is purged with the inert gas.

Cleaning gases, e.g., $ClF_3$ and $NF_3$ gases, are introduced periodically from the gas supply unit 13 into the treatment chamber 10, and high-frequency voltage is applied between the plasma electrode 36 for cleaning, for example, and the wall portion of the chamber 10, whereby the $ClF_3$ and $NF_3$ gases are converted into plasmas. The inert gas is also fed into the protective pipe 31 in removing by-products of reaction adhering to the wall portion of the treatment chamber 10, ceramic heater 14, or protective pipe 31 by etching. The $ClF_3$ and $NF_3$ gases need not always be converted into plasmas.

According to the present embodiment, the upper end portion (i.e., ring body 26 shown in FIG. 3) of the metallic pipe 23 if formed of molybdenum or the like whose coefficient of thermal expansion resembles that of ceramics, so that the joint portions can be prevented from cracking. Since the metallic pipe 23 is loaded with the inert gas and contains the feeders 20 and the thermocouple unit 30, the feeders 20 and the terminals 18 are fully isolated from the atmosphere in the treatment chamber 10, so that they cannot be deteriorated by the treatment gases or cleaning gases. At high temperature, moreover, the flexible tube 24 can absorb the thermal expansion of the metallic pipe 23.

According to the embodiment arranged in this manner, the metallic pipe 23 which protects the feeders 20 is isolated from the treatment gas atmosphere by the inert gas. Microscopically, a very small quantity of the treatment gases may get into the pipe 23 along the surface of the contact portion of the protective pipe 31. Owing to the purging with the inert gas, however, there is no possibility of the metallic pipe 23 being corroded by the treatment gases. Although the $ClF_3$ and $NF_3$ gases used to clean the treatment chamber 10 are very corrosive gases, they cannot corrode the metallic pipe 23, since they are substantially prevented from touching the pipe 5. Accordingly, no corrosion products are generated on the surface of the metallic pipe 23, so that there is no problem of production of particles of separated corrosion products. Since the protective pipe 31 is formed of quartz, moreover, it cannot be deteriorated by the $ClF_3$ and $NF_3$ gases. Since the protective pipe 31 and the ceramic heater 14 are softly in contact with each other, furthermore, heat transfer from the heater 14 is not very efficient. Since the top portion of the protective pipe 31 cannot be heated to a reaction temperature, therefore, a film forming reaction (reaction for formation of TiN) cannot easily occur. In consequence, adhesion of reaction products can be restrained, and production of particles can be prevented. According to the first embodiment, however, only the protective pipe 31 may be provided without the use of the metallic pipe 23. Also in this case, corrosion of exposed portions of the terminals and feeders can be prevented.

Figure 5:
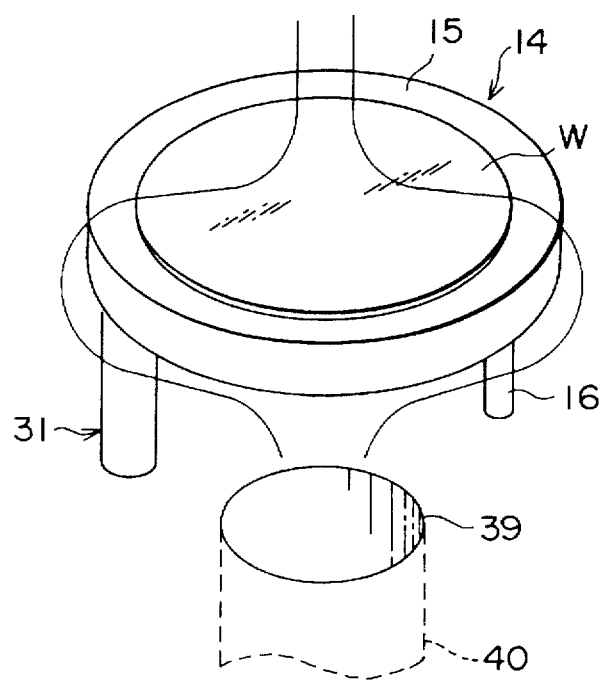
FIG. 5 is a diagram for illustrating a flow of treatment gases.
Figure 7:
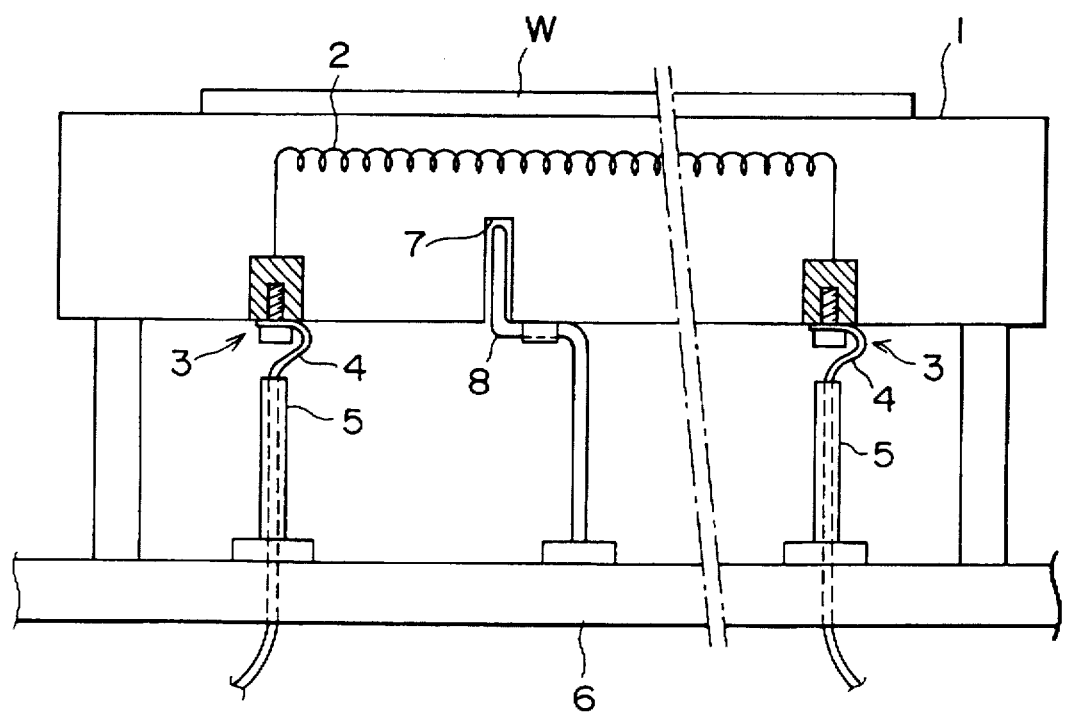
FIG. 7 is a longitudinal sectional view showing an arrangement of a feed path of a conventional ceramic heater.

The exhaust port 39 of the treatment chamber 10 is located in the center. After the treatment gases supplied from the gas supply unit 13 fall on the surface of the wafer W, therefore, they uniformly spread sideways to be discharged into the exhaust port 39, as shown in FIG. 5. Accordingly, the flow of the treatment gases on the wafer surface is uniform, so that high-uniformity film formation can be achieved.

In maintaining the CVD apparatus described above, screws (not shown) are removed from the base plate 21 and side wall portion of the treatment chamber 10, as shown in FIG. 6. Thereafter, the base plate 21 is lowered together with the exhaust pipe 40 and the turbo molecular pump 41 by means of the jack mechanism 43, whereupon the internal components mounted on the base plate 21, including the ceramic heater 14, pusher pin drive mechanism 38, plasma electrode 36 for cleaning, wiring arrangement portion of the heater 14, etc., can be drawn out. Thus, the CVD apparatus can be maintained much more easily than in the case of an arrangement such that the treatment chamber 10 is dismantled.

The to-be-treated object is not limited to a wafer, and the gas treatment is not limited to film formation, and may be etching.

According to the first embodiment, as described above, the feeders of the ceramic heater for heating the to-be-treated object are enclosed with the anticorrosion protective pipe, which is purged with the inert gas. Thus, corrosion of the feeders and terminals can be prevented, production of particles can be restrained, and the working life of apparatus can be lengthened.

Since the contact between the protective pipe and the heating means is soft, the temperature of the end portion of the protective pipe is lower than the reaction temperature. In the case of film formation, for example, therefore, a film cannot be easily formed on the end portion of the protective pipe, so that particles can be restrained from being produced.

Since the feeders are contained in the anticorrosion metallic pipe, moreover, they can be securely prevented from being corroded. Since the surface of the metallic pipe is protected against the treatment gases or cleaning gases, furthermore, it cannot be corroded, so that production of particles can be prevented.

Figure 8:
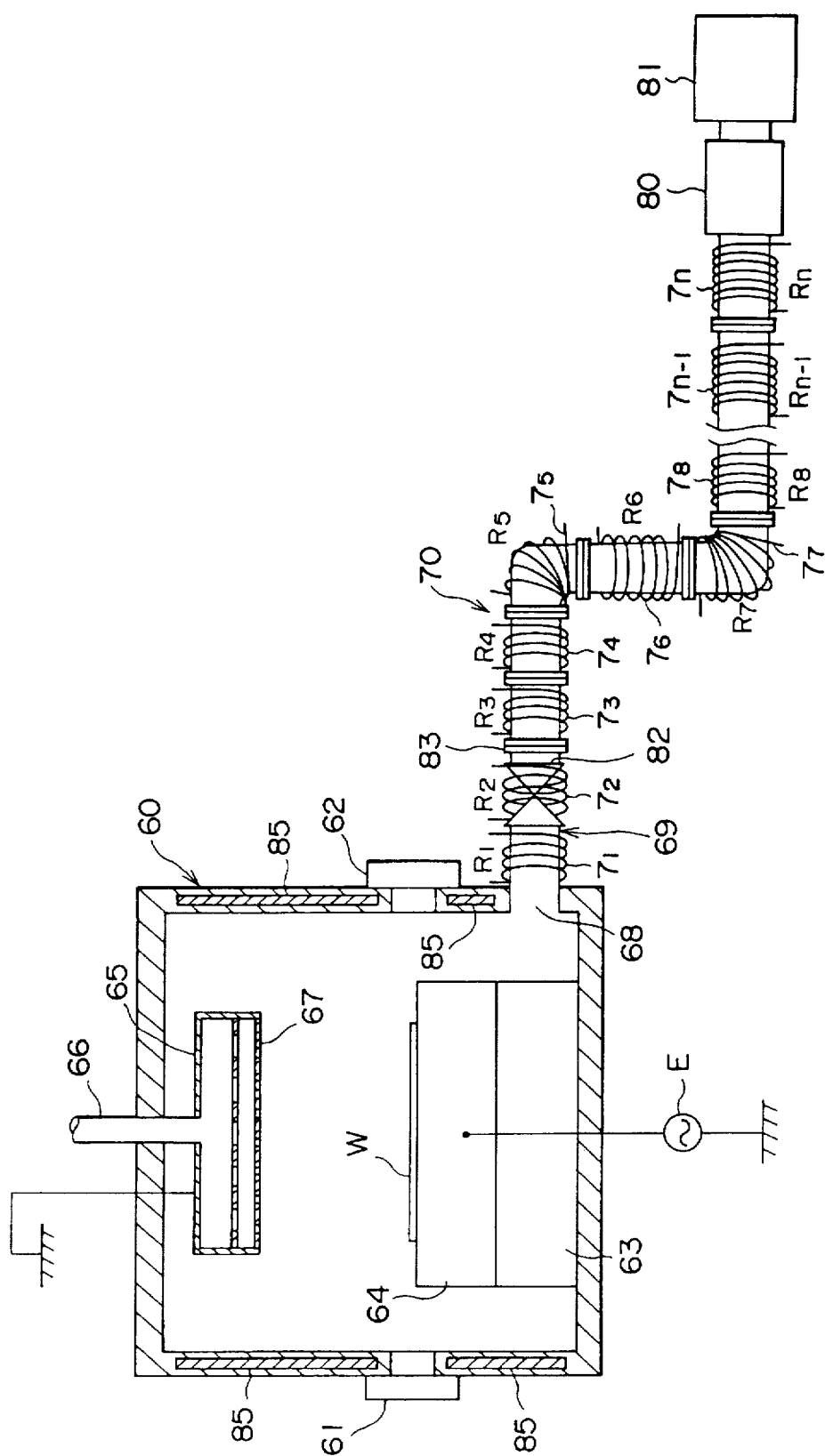
FIG. 8 is a sectional view showing a treatment apparatus according to a second embodiment of the invention.
Figure 9:
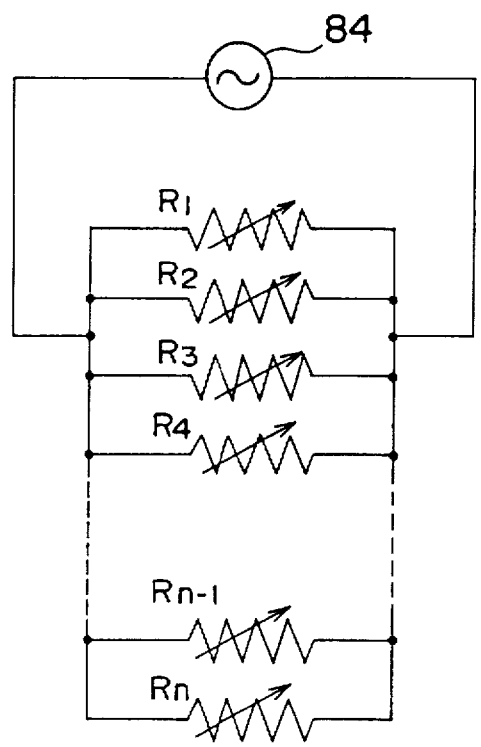
FIG. 9 is a wiring diagram of heating means according to the second embodiment.
Figure 10:
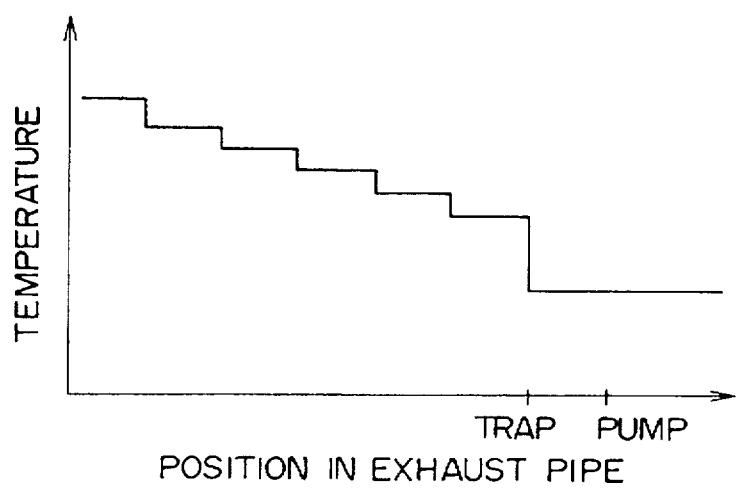
FIG. 10 is a diagram showing a characteristic curve representing the relationship between the position of an exhaust pipe in its longitudinal direction and the temperature in the exhaust pipe in the position concerned.

Referring now to FIGS. 8 to 10, a treatment apparatus according to a second embodiment of the present invention will be described. FIG. 8 is a schematic sectional view showing an outline of a vacuum treatment apparatus, e.g., a plasma CVD apparatus, according to the second embodiment. In FIG. 8, numeral 60 denotes an airtight treatment chamber, which is provided with gate valves 61 and 62 on its outside wall for hermetically sealing the gaps between the chamber 60 and load locking chambers (not shown). Located on the central portion of the bottom surface of the treatment chamber 60 is an insulating member 63, which is formed of an insulator, such as aluminum, and is cylindrical in shape, for example.

The insulating member 63 carries thereon a susceptor 64 of an electrically conductive metal, such as aluminum, which constitutes one electrode or a lower electrode for generating a plasma. A semiconductor wafer W is placed on the susceptor 64. The susceptor 64 is connected to one end side of a high-frequency power source E of 500 kHz to 200 MHz, e.g., a 13.56-MHz power source.

The susceptor 64 is overlain by a grounded upper electrode 65 which doubles as a gas inlet portion. The upper electrode 65 is connected with a gas supply pipe 66 through which treatment gases, such as $SiH_2Cl_2$ gas and $NH_3$ gas, are fed into the treatment chamber 60. Located on the underside of the upper electrode 65 is a gas diffusing plate 67 for feeding the treatment gases like a shower, for example, into the treatment chamber 60.

An exhaust pipe 69 is attached to the lower part of the treatment chamber 60 by means of an exhaust port 68. An end portion of the exhaust pipe 69 is connected with vacuum exhaust means, e.g., a vacuum pump 81, by means of a trap 80 for use as recovery means for by-products of reaction. In the present embodiment, the exhaust pipe 69 is composed of a plurality of unit pipes connected in a series, and a valve 82 is inserted in the middle of the pipe 69. The exhaust pipe 69 and the valve 82 constitute an exhaust line. The exhaust pipe 69 need not always be divided. In FIG. 8, numeral 83 denotes a joint between each two unit pipes (each unit pipe is described as a short structure for ease of illustration).

First heating means, e.g., a heater 85, is embedded in each side wall of the treatment chamber 60. The heater 85 is used to heat the inner wall surface of the treatment chamber 60 to a predetermined temperature ranging from, e.g., 50° to 250° C., at which by-products of reaction of other deposits cannot adhere to the inner wall surface of the chamber 60.

Second heating means, e.g., a tape heater 70, is provided around the divided exhaust pipe 69 so as to cover the overall length thereof. The tape heater 70 is composed of, for example, unit heaters $7_1$ to $7_n$ which, corresponding individually to the unit pipes, are wound around the exhaust pipe 69. As shown in FIG. 9, the unit tape heaters are connected in parallel with one another and to a power source 84. Connected in parallel in this manner, the unit tape heaters $7_1$ to $7_n$ have the same potential at each end thereof, so that resistance values and heat release values can be varied by changing the respective lengths of the individual unit heaters. Thus, the unit tape heaters $7_1$ to $7_n$ are designed so as to adjust the heat release values. In FIG. 9, the respective lengths and resistance values of the unit tape heaters are not made to correspond to one another for convenience sake. For example, the resistance value R is set so that it gradually decreases as the vacuum pump 81 is approached, that is, resistance values $R_1$ and $R_n$ on the sides of the treatment chamber 60 and the vacuum pump 81 are maximum and minimum values, respectively, as indicated by expression (7) as follows:

$$R_1 > R_2 > R_3 \ldots R_{n-1} > R_n. \quad (7)$$

For example, the unit tape heater $7_n$, which is wound around the unit pipe adjacent to the trap 80, is adjusted so that the negative temperature gradient between the unit heaters $7_{n-1}$ and $7_n$ is greater than the negative temperature gradient on the upper-course side.

The following is a description of the operation of the embodiment described above.

First, the semiconductor wafer W, a to-be-treated object, is carried into the treatment chamber 60 through the gate valve 61 and placed on a wafer bearing surface of the susceptor 64 by means of a reaction arm (not shown). The film forming gases, such as $SiH_2Cl_2$ gas and $NH_3$ gas, are fed at a predetermined rate from the gas supply pipe 66 into treatment chamber 60 through the upper electrode 65 and the gas diffusing plate 67. Also, the treatment chamber 60 is evacuated through the exhaust pipe 69 by means of the vacuum pump 81 so that its interior is kept at a predetermined degree of vacuum, e.g., 1 Torr. As this is done, high-frequency voltage is further applied between the susceptor 64 and the upper electrode 65 to generate a plasma under the electrode 65, thereby forming a film on the wafer W.

During this film formation, the exhaust pipe 69 is heated by means of the tape heater 70 in order to prevent by-products of reaction, e.g., $NH_4Cl$, from the aforesaid gases from separating out by cohesion and adhering to the inner wall of the exhaust pipe 69. Since the unit tape heaters $7_1$ to $7_n$ are connected in parallel with one another, as mentioned before, the heat release values can be varied for the individual unit heaters to adjust the heating temperature by changing, for example, the respective lengths and resistance values of the unit heaters. Accordingly, the heating temperature can be partially adjusted throughout the length of the exhaust pipe 69, so that the temperature of the pipe 69 can be regulated.

In the present embodiment, the unit tape heater $7_1$ on the side of the treatment chamber 60 has the maximum resistance value $R_1$, and the resistance value of the tape heater 70 is set so as to decrease gradually as the vacuum pump 81 is approached. Since the heating temperature T of the tape heater 70 is proportional to the resistance value R, the unit tape heater $7_1$ on the side of the treatment chamber 60 is at a maximum temperature, the temperature gradually decreases as the vacuum pump 81 is approached, and the unit tape heater $7_n$ on the side of the pump 81 is at a minimum temperature, as indicated by equation (8) as follows:

$$T_1 > T_2 > T_3 \ldots T_{n-2} > T_n. \quad (8)$$

Figure 16:
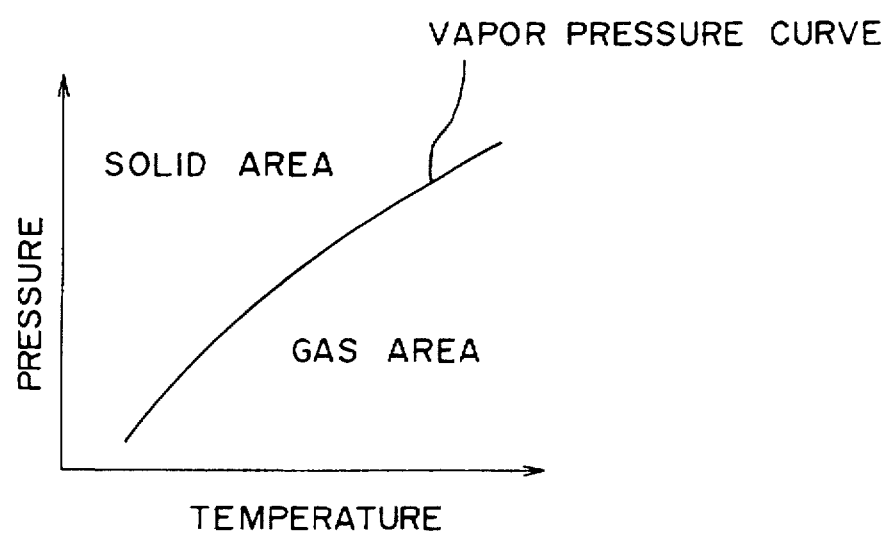
FIG. 16 is a diagram showing a vapor pressure curve.

FIG. 10 is a diagram showing the relationship between the position of the exhaust pipe in its longitudinal direction and the temperature in the exhaust pipe in the position concerned. In order to prevent adhesion of by-products of reaction, the inner surface of the exhaust pipe 69 must be heated to a temperature not lower than the sublimation temperature. The treatment chamber 60 is evacuated through the exhaust pipe 69 by means of the vacuum pump 81. In the case of the aforesaid process, the pressure in the exhaust pipe 69 is lowered as the vacuum pump 81 is approached. For example, the pressure in the exhaust port is 0.8 Torr, while the pressure in the position just short of the vacuum pump 81 is 0.001 Torr. Referring to the aforementioned vapor pressure curve of FIG. 16, the sublimation temperature lowers in proportion to the pressure, so that the heating temperature can be lower on the side of the vacuum pump 81 than on the side of the treatment chamber 60.

Thus, if the tape heater 70 is provided so that the heating temperature gradually lowers (so that the temperature gradient is negative) as the vacuum pump 81 is approached, as mentioned before, the exhaust pipe 69 is heated at appropriate temperatures such that no by-products of reaction adhere to various parts of the pipe 69, that is, at temperatures which match sublimation temperatures at the various parts, depending on the pressure in the pipe 69. Accordingly, the adhesion of by-products of reaction in the exhaust pipe 69 can be prevented in a manner such that waste of heating energy is reduced. Thus, the exhaust pipe 69 can be prevented from being corroded so that its maintenance is easier, and moreover, energy can be saved.

Also, the temperature in the trap 80 can be adjusted so as to be not higher than the sublimation temperature, and the temperature gradient of that portion of the exhaust pipe 69 just short of the trap 80 is increased as the trap 80 is approached so that the temperature of the pipe 69 is lowered to a level which is very close to the sublimation temperature, for example. Thus, the by-products of reaction can be condensed and caused compulsorily to separate out in the trap 80. By forming this trap, therefore, the by-products of reaction can be prevented from getting in a gaseous phase into the vacuum pump 81 through the trap, so that the maintenance of the pump 81 is easier.

According to the second embodiment described above, the tape heater 70 may be provided on part of the exhaust pipe 69, or a plurality of tape heaters 70 may be arranged having the same resistance value. The resistance value for each unit tape heater may be adjusted by inserting a variable resistor in the middle of each unit heater, by providing a power control unit for each unit heater to regulate the power, or by using different power sources for the individual unit heaters, instead of adjusting the length of each unit heater. It is to be desired, moreover, that the heater should be formed of a material whose resistance is susceptible to temperature, that is, whose resistance lowers as the temperature of the material itself increases. Carbon (C) and silicon carbide (Sic) are examples of the material of this kind. Since the resistance value decreases with the increase of the temperature, current is allowed to flow easily, so that the heat release value can be increased.

It is necessary, furthermore, only that the heating temperature of the tape heater have a negative gradient toward the vacuum pump. In the present embodiment, the negative temperature gradient is adjusted for each unit pipe. Alternatively, however, each unit pipe may be further divided so that the temperature gradient can be finely adjusted. Alternatively, moreover, a temperature pattern may be provided such that a uniform heating temperature is lowered at a point just short of the trap. Furthermore, the exhaust pipe need not always be provided with the trap. The present invention may be also applied to vacuum treatment apparatuses for vacuum treatments, such as heat CVD, metal CVD, etching, ashing, etc., as well as plasma CVD.

According to the second embodiment, a plurality of heating means are arranged in the longitudinal direction at least in part of the exhaust line, so that by-products of reaction can be prevented from separating out and adhering to the inner wall of the exhaust line. Since the heating means are connected in parallel with one another, moreover, the heating temperature can be adjusted for each heating means, and the exhaust line can be heated at appropriate temperatures for the respective sublimation temperatures of various parts thereof. Thus, the adhesion of by-products of reaction in the exhaust line can be prevented in a manner such that waste of heating energy is reduced. In the case where the exhaust line is provided with the trap, the by-products of reaction can be securely condensed and caused to separate out in the trap.

Figure 11:
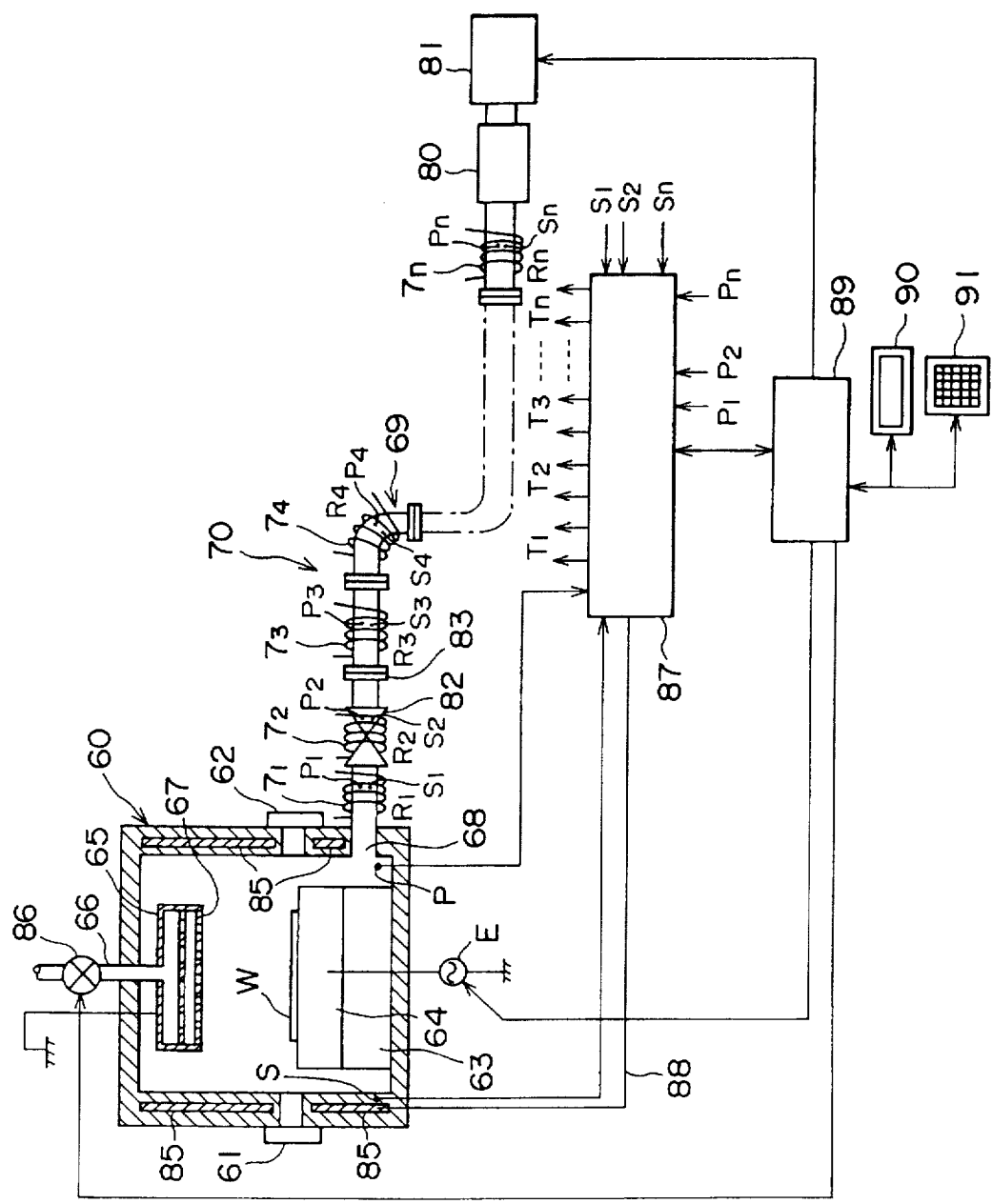
FIG. 11 is a sectional view showing a treatment apparatus according to a third embodiment of the invention.

Referring now to FIGS. 11 to 14, a treatment apparatus according to a third embodiment of the present invention will be described. FIG. 11 is a schematic sectional view showing an outline of the treatment apparatus, e.g., a plasma CVD apparatus, according to the third embodiment. Like reference numerals are used to designate the same members of the second embodiment, an description of those members is omitted.

First heating means, e.g., a heater 85, is embedded in each side wall of a treatment chamber 60. The heater 85 is used to heat the inner wall surface of the treatment chamber 60 to a predetermined temperature ranging from, e.g., 50° to 250° C., at which by-products of reaction or other deposits cannot adhere to the inner wall surface of the chamber 60. The treatment chamber 60 is provided with a temperature sensor S for detecting the temperature of the inner wall of the chamber 60 and a pressure sensor P for detecting the pressure in the chamber 60. An on-off valve e.g., a solenoid valve 86, is inserted in a gas supply pipe 66.

A tape heater 70 is composed of unit heaters $7_1$ to $7_n$ which, corresponding individually to unit pipes of an exhaust pipe 69, are wound around the pipe 69. Power supply terminals $R_1$ to $R_n$ of the heater 70 are connected to a temperature control unit 87 shown in FIG. 11. The control unit 87 enables the unit tape heaters $7_1$ to $7_n$ for the individual unit pipes to be supplied individually with desired electric powers so that the unit pipes of the exhaust pipe 69 can be heated independently of one another.

The temperature control unit 87 is designed so as to receive detection signals from temperature sensors $S_1$ to $S_n$ and pressure sensors $P_1$ to $P_n$, which are attached individually to the unit pipes of the exhaust pipe 69. The desired powers are supplied individually to the unit tape heaters $7_1$ to $7_n$ in accordance with the detection signals from their corresponding temperature sensors $S_1$ to $S_n$.

Also, the temperature control unit 87 is arranged so as to receive a detection signal from the temperature sensor S for detecting the temperature of the inner wall of the treatment chamber 60, and to supply a desired power to the heater 85 by means of a feeder 88. Moreover, a control unit 89, which includes a microcomputer, gives the temperature control unit 87 information for the temperatures to which the unit tape heaters $7_1$ to $7_n$ or the heater 85 is to be adjusted. The control unit 89 is designed so as to obtain temperature information for each unit pipe of the exhaust pipe 69 from the temperature control unit 87 with the passage of time.

The control unit 89 is connected with display means, e.g., display 90, and input means, e.g., a keyboard 91, for inputting preset temperature values and the like. The control unit 89 is designed so as to control the solenoid valve 86, a vacuum pump 81, a high-frequency power source E, etc. independently, and to control the whole apparatus.

The following is a description of the operation of the embodiment described above.

In the vacuum treatment apparatus constructed in this manner, a wafer W is first carried into the treatment chamber 60 and placed on a susceptor 64. Thereafter, the solenoid valve 86 is opened in response to a control signal from the control unit 89, whereupon film forming gases are fed into treatment chamber 60 through the gas supply pipe 66, thereby forming a film on the wafer W.

During this film formation, the temperature of the inner wall of the treatment chamber 60 is detected by means of the temperature control unit 87 as the heater 85 is heated to be kept at a predetermined temperature, in order to prevent by-products of reaction, e.g., $NH_4Cl$, from the film forming gases from separating out by cohesion and adhering to the inner wall of the chamber 60. The temperature of the inner wall of the treatment chamber 60 in this state is settled in accordance with the vapor pressure curve. Thus, the temperature of the inner wall of the treatment chamber 60 is controlled depending on the pressure in the chamber 60 by means of the temperature control unit 87 so that it is higher than the sublimation temperature for the pressure concerned. Preferably, the temperature of the inner wall of the treatment chamber 60 is previously kept at a predetermined value before a plasma is generated, since the generation of the plasma results in production of by-products of reaction.

Since $NH_4Cl$ adheres also to the inner wall of the exhaust pipe 60, moreover, the pipe 69 is heated by means of the tape heater 70 in a manner such that the power level is controlled by means of the temperature control unit 87. In this case, the pressure in the exhaust pipe 69 is lowered as the vacuum pump 81 is approached. For example, the pressure in an exhaust port 68 is 0.8 Torr. while the pressure in the position just short of the vacuum pump 81 is 0.001 Torr. Thus, each unit pipe has its own sublimation temperature. The temperatures in the unit pipes are detected individually by the temperature sensors $S_1$ to $S_n$, and the volumes of power supply to the unit tape heaters $7_1$ to $7_n$ are controlled in accordance with the detected values by the temperature control unit 87 so that the temperature in each unit pipe is not lower than the sublimation temperature.

The sublimation temperature of $NH_4Cl$ varies depending on pressure. In preventing adhesion of $NH_4Cl$, therefore, the pressures in the individual unit pipes of the exhaust pipe are detected in advance, preset temperatures to define the gas-area side of the vapor pressure curve for $NH_4Cl$ are given as data for the pressures in the unit pipes to the control unit 89. The volumes of power supply to the unit tape heaters $7_1$ to $7_n$ are controlled so that the detected temperature values are equal to the values of the preset temperatures, thus obtained for the unit pipes. Alternatively, the volumes of power supply to the unit tape heaters $7_1$ to $7_n$ may be controlled so that the detected temperature values become equal to the values of preset temperatures to define the gas-area side, which are calculated on the basis of the values of pressures in the individual unit pipes detected during the treatment and the vapor pressure curve for $NH_4Cl$, after the vapor pressure curve is given as data to the control unit 89.

Since the treatment chamber 60 is evacuated through the exhaust pipe 69 by means of the exhaust pipe 69, the pressure in the chamber 60 is higher than the pressure in the pipe 69. As mentioned before, the pressure in the exhaust pipe 69 lowers as the vacuum pump 81 is approached. Therefore, the sublimation temperatures of the by-products of reaction vary depending on the differences in pressure between places. Accordingly, the treatment chamber 60 is heated to a maximum temperature by means of the heater 85, and the heating temperature for the exhaust pipe 69 lowers as the vacuum pump 81 is approached.

The aforesaid production of the by-products of reaction depends greatly on the treatment process conditions, e.g., the kinds of the treatment gases, properties of the to-be-treated object, etc. Whether or not the by-products are discharged in a gaseous phase depends on the pressures and temperatures for the treatment process, as mentioned before. It is more advisable, therefore, to change the temperature of the inner wall of the treatment chamber 60 and the temperatures in the unit pipes depending on the treatment process.

Figure 12:
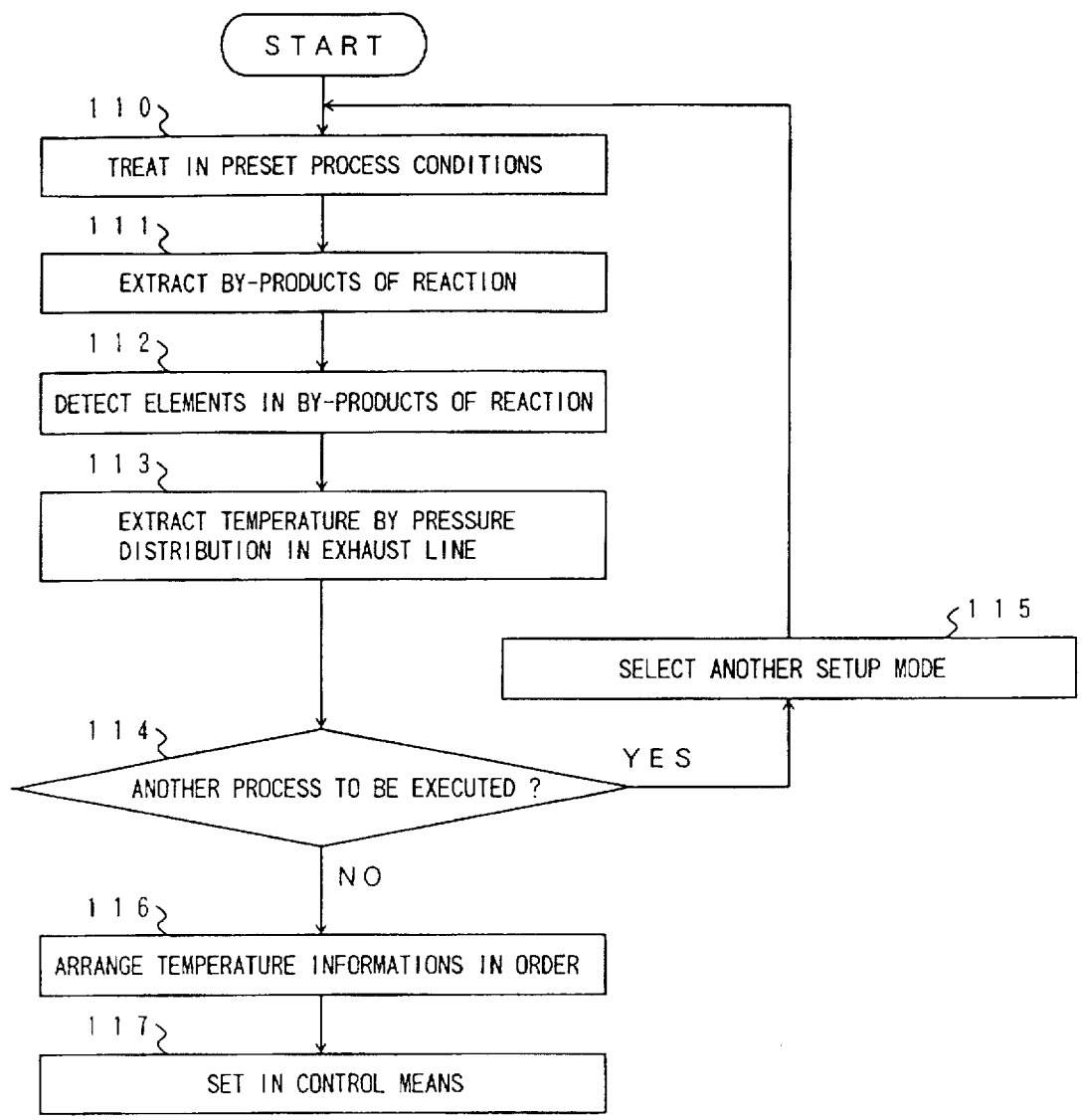
FIG. 12 is a flowchart for illustrating an operation for extracting vapor pressure curves.

FIG. 12 is a flowchart for obtaining vapor pressure curve values for by-products of reaction. In Step 110 of FIG. 12, the target object is treated under predetermined process conditions, including the treatment pressure, treatment gases, and object temperature. Then, in Step 111, by-products of reaction adhering to the inner wall of the treatment chamber 60 or the exhaust pipe 69 are extracted. In Step 112, the compositions and kinds of the by-products of reaction are detected by means of a detecting device, such as a mass spectrograph, and vapor pressure curves for the detected by-products are prepared.

Then, in Step 113, the temperature of the inner wall of the treatment chamber 60 or the temperature in the exhaust pipe 69 is set at a value not lower than the sublimation temperature value, and controlled variables for the heater 85 and the unit tape heaters $7_1$ to $7_n$, that is, the volumes of power supply to the unit heaters, are obtained.

Figure 13:
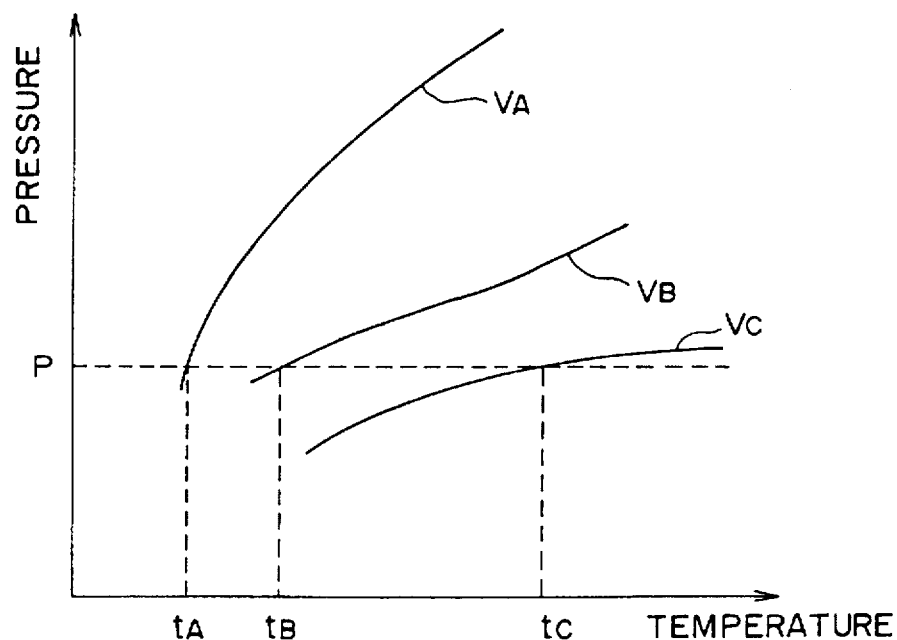
FIG. 13 is a diagram showing vapor pressure curves for substances produced in the processes of FIG. 12.

If a plurality of kinds of by-products of reaction are detected in Step 112, vapor pressure curves for all the detected by-products are prepared, and the controlled variables for the unit tape heaters $7_1$ to $7_n$ are obtained with reference to the prepared curves. FIG. 13 shows vapor pressure curves VA, VB and VC prepared when three kinds of by products A, B and C are detected (A, B and C correspond to VA, VB and VC, respectively), for example. Preferably, the temperature of the inner wall of the treatment chamber 60 or the temperature in the exhaust pipe 69 should be set with reference to the vapor pressure curve VC for the by-product C which has the highest sublimation temperature for a certain pressure, as shown in FIG. 13. When the pressure in the treatment chamber 60 or the exhaust pipe 69 is P, the sublimation temperatures of the reaction by-products A, B and C are tA, tB and tC, respectively. If the temperatures of the heater 85 and the like are set with reference to the vapor pressure curve VA for the by-product A, for example, however, the temperature in the treatment chamber 60 or the exhaust pipe 69 is lower than the sublimation temperatures of the by-products B and C, since tA is lower than tB and tC. Thus, there is a substantial possibility of the by-products B and C adhering to the inner wall of the chamber 60 or the pipe 69.

Subsequently, if the to-be-treated object is treated under one of the aforesaid process conditions in Step 114, the program advances to Step 116. If any other process conditions, such as the kinds or flow rates of the treatment gases, treatment pressures, high-frequency power levels, are changed, the program returns to Step 110 via Step 115 or a selection process for another setup mode. In the same manner as the aforementioned method, the temperature of the inner wall of the treatment chamber 60 or the temperature in the exhaust pipe 69 is set corresponding to a plurality of process conditions, and the controlled variables for the heater 85 and the unit tape heaters $7_1$ to $7_n$ are obtained.

Figure 14:
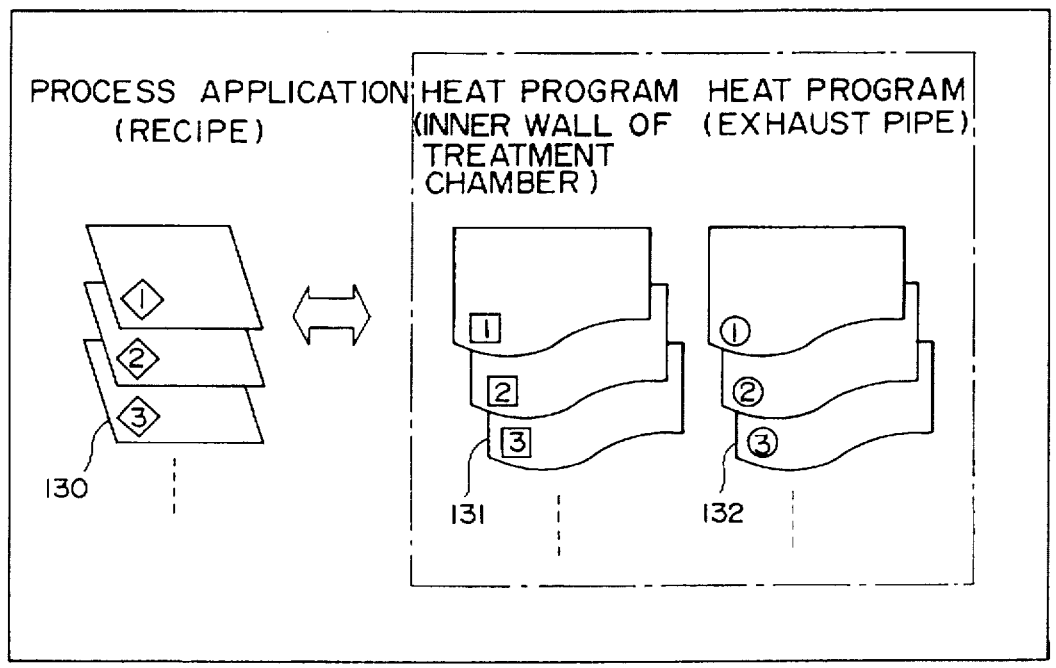
FIG. 14 is a diagram for illustrating set values to be set in control means in the processes of FIG. 12.
Figure 15:
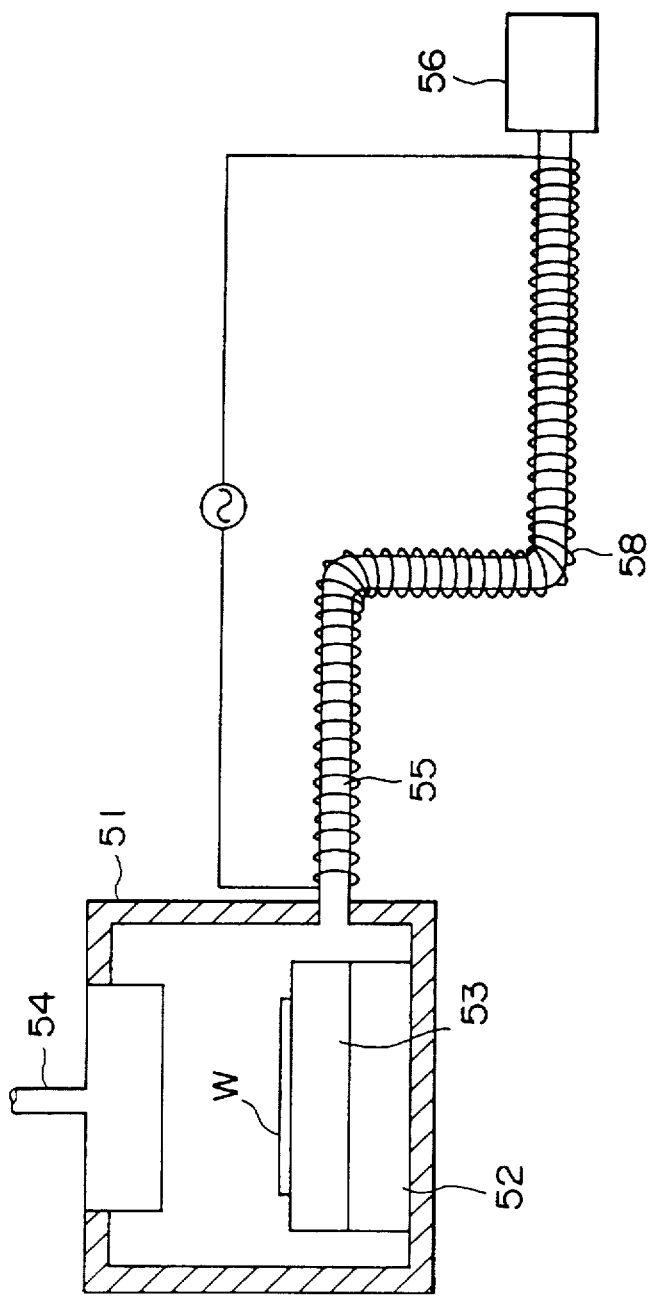
FIG. 15 is a sectional view showing a conventional vacuum treatment apparatus.

In Step 116, the set value of the temperature of the inner wall of the treatment chamber 60 or the temperature in the exhaust pipe 69, corresponding to the process conditions set in the aforesaid manner, and the controlled variables for the heater 85 and the unit tape heaters $7_1$ to $7_n$ are arranged in order. Then, in Step 117, these set values are registered in the control unit 89 by means of the keyboard 91 shown in FIG. 11, for example. More specifically, as shown in FIG. 14, the control unit 89 is registered with the set value of the temperature of the inner wall of the treatment chamber 60, as a heat program 131, and the set value of the temperature in the exhaust pipe 69, as a heat program 132, corresponding to treatment steps 130 (recipes) for treatments of various to-be-treated objects. In starting a treatment, the control unit 89 orders control information for the temperature control unit 87 in accordance with the treatment steps 130.

Thus, according to the embodiment described above, the inner wall of the treatment chamber 60 is heated to a level higher than the sublimation temperatures of the by-products of reaction for a certain pressure by means of the heater 85 which is provided in the inner wall of the chamber 60. Accordingly, the by-products are heated at an appropriate temperature such that they do not adhere to the inner wall of the treatment chamber 60, depending on the pressure in the chamber 60. Thus, the by-products of reaction can be prevented from adhering to the inner wall of the treatment chamber 60 in a manner such that waste of heating energy is reduced.

Accordingly, production of particles attributable to the adhesion of the by-products of reaction can be reduced, so that the yield of to-be-treated objects can be improved, and the frequency of cleaning of the treatment chamber 60 can be reduced to improve the operating efficiency of the vacuum treatment apparatus. Since the temperature of the inner wall of the treatment chamber 60 is set to be higher than the temperature in the exhaust pipe 69, the fully heated by-products of reaction in a gaseous phase pass through the exhaust port of the pipe 69. Thus, the gases which pass through the exhaust port absorb little heat energy, so that heat energy can be supplied efficiently to the wall of the exhaust pipe 69. In consequence, waste of heating energy can be further reduced.

In the case where a plurality of kinds of by-products of reaction are produced, moreover, the heating temperatures for the treatment chamber 60 and the exhaust pipe 69 are set with reference to the vapor pressure curve for the by product of reaction which has the highest sublimation temperature for a certain pressure. Accordingly, the by-products of reaction can be securely prevented from adhering to the treatment chamber 60 and the exhaust pipe 69.

Further, the control unit 89 is registered with the respective set values of the temperature of the inner wall of the treatment chamber 60 and the temperature in the exhaust pipe 69 which correspond to the various process steps 130 with different process conditions. In starting a treatment, the control information is delivered to the temperature control unit 87 in accordance with the treatment steps 130. Even though the process conditions are changed, therefore, the by-products of reaction can be prevented from adhering to the treatment chamber 60 and the exhaust pipe 69.

Furthermore, elements in the exhaust gas flowing in the exhaust pipe 69 are analyzed continually, and at the same time, the pressures are detected on each occasion by means of the pressure sensors $P_1$ to $P_n$, and these data are delivered as inputs to the control unit 89. Then, the control unit 89 delivers signals to the unit tape heaters $7_1$ to $7_n$ with reference to vapor pressure curves for the analyzed elements so that the temperature of the exhaust gas is in the gas area. In this case, adhesion of the exhaust gas can be controlled on a real-time basis.

According to the second and third embodiments described above, the tape heater 70 is wound on the outer wall of the exhaust pipe 69. The present invention is not, however, limited to those embodiments, and any other heating means may be used for any temperatures provided that the temperature of the inner wall surface of the exhaust pipe 69 on the side of the vacuum pump 81 is not lower than the sublimation temperatures of the by-products of reaction. For example, a coil-shaped heater may be wound on the outer wall of the exhaust pipe 69, or the tape heater or coil-shaped heater may be embedded in the outer wall of the exhaust pipe 69. Alternatively, the tape heater 70 may be provided on part of the exhaust pipe 69, or a plurality of unit pipes of the exhaust pipe 69 may be heated to the same temperature by means of a plurality of tape heaters 70.

The heat release value for each unit tape heater may be controlled by adjusting the length of the unit heater, as in the second embodiment, or by adjusting the volume of power supply, as in the third embodiment. Moreover, the heat release value may be controlled by inserting a variable resistor in the middle of each unit heater. It is to be desired, moreover, that the heater should be formed of a material whose resistance is susceptible to temperature, that is, whose resistance lowers as the temperature of the material itself increases. Carbon (C) and silicon carbide (Sic) are examples of the material of this kind. Since the resistance value decreases with the increase of the temperature, current is allowed to flow easily, so that the heat release value can be increased.

It is necessary, furthermore, only that the heating temperature of the tape heater have a negative gradient toward the vacuum pump. In the present embodiment, the negative temperature gradient is adjusted for each unit pipe. Alternatively, however, each unit pipe may be further divided so that the temperature gradient can be finely adjusted. Alternatively, moreover, a temperature pattern may be provided such that a uniform heating temperature is lowered at a point just short of the trap. Furthermore, the exhaust pipe need not always be provided with the trap, and an exhaust gas processing device may be provided in or next to the vacuum pump.

In connection with the foregoing embodiments, by-products of reaction in the CVD apparatus have been described as exhausted substances. In an etching apparatus, for example, however, by-products of reaction between the treatment gases and components scraped off from the surface of the film formed on the wafer surface are produced. Accordingly, the exhausted substances are not limited to by-products of reaction, and may be any other deposits which can adhere to the exhaust line. Thus, the present invention may be also applied to treatment apparatuses for heat CVD, metal CVD, etching, ashing, and other treatments.

Although the semiconductor wafer has been described as the to-be-treated object, it may be replaced with an LCD substrate or the like.

According to the third embodiment, a plurality of heating means are arranged in the longitudinal direction at least in part of the exhaust line, so that exhausted substances can be prevented from separating out and adhering to the inner wall of the exhaust line. Since the heating means are connected in parallel with one another, moreover, the heating temperature can be adjusted for each heating means, and the exhaust line can be heated at appropriate temperatures for the respective sublimation temperatures of various parts thereof. Thus, the adhesion of exhausted substances in the exhaust line can be prevented in a manner such that waste of heating energy is reduced. In the case where the exhaust line is provided with the trap, the exhausted substances can be securely condensed and caused to separate out in the trap.

If the inner wall of the treatment chamber and the exhaust line are provided with the first and second heating means, respectively, adhesion of exhausted substances to the inner wall of the treatment chamber, as well as to the exhaust line, can be restrained. If control means are provided for individually controlling the first and second heating means in accordance with pressure and temperature signals for the interior of the treatment chamber and the exhaust line, the inner wall of the treatment chamber and the exhaust line can be heated at appropriate temperatures for the respective sublimation temperatures of the exhausted substances discharged from the treatment chamber. Thus, the adhesion of the exhausted substances to the inner wall of the treatment chamber and the exhaust line can be prevented in a manner such that waste of heating energy is reduced. Since the control unit is registered with various process conditions, moreover, the first and second heating means can be controlled in conformity to the process conditions even though the conditions are changed. Thus, the exhausted substances can be prevented from adhering to the inner wall of the treatment chamber and the exhaust line.

While the presently preferred embodiments of the present invention have been shown and described, it is to be understood that this disclosure is for the purpose of illustration and that various changes and modifications may be made without departing from the scope of the invention as set forth in the appended claims.

What is claimed is:

1. A treatment apparatus for treating a to-be-treated object in a treatment chamber with a treatment gas, comprising:

heating means including an insulator carrying the to-be-treated object thereon and a resistance heating element therein for heating the to-be-treated object;

electrical supply means including feeders extending into the treatment chamber from outside and terminals connecting the feeders and the resistance heating element;

a metallic pipe surrounding the terminals and those portions of the feeders which extend in the treatment chamber;

a protective pipe surrounding the metallic pipe; and gas supply means for feeding an inert gas into an interior of the protective pipe.

2. The treatment apparatus according to claim 1, wherein said metallic pipe includes a ring body bonded to the insulator, the ring body having a coefficient of thermal expansion approximate to that of the insulator.

3. The treatment apparatus according to claim 2, wherein said metallic pipe includes a flexible tube in the middle surrounding the terminals and those portions of the feeders which extend in the treatment chamber.

4. The treatment apparatus according to claim 1, further comprising gas supply means for feeding an inert gas into the metallic pipe.

5. The treatment apparatus according to claim 1, further comprising discharge means for discharging the inert gas from the protective pipe into the treatment chamber.

6. The treatment apparatus according to claim 5, wherein said protective pipe has a proximal end supported on the bottom surface of the treatment chamber and a distal end in contact with the insulator, and said discharge means includes means for allowing the inert gas to be discharged into the treatment chamber when the pressure of the inert gas fed into the protective pipe exceeds a predetermined value.

7. An assembly for use with a treatment apparatus having feeders and terminals of a heating element, comprising:

a metallic pipe surrounding said feeders and said terminals of said heating element;

a protective pipe surrounding said metallic pipe; and gas supply means for supplying gas into said protective pipe.

* * * * *